United States Patent [19]
Vagher

[11] Patent Number: 5,613,233
[45] Date of Patent: Mar. 18, 1997

[54] APPARATUS WITH DISTORTION CANCELLING FEEDBACK SIGNAL

[75] Inventor: Michael R. Vagher, Cedar Rapids, Iowa

[73] Assignee: Rockwell International Corp., Seal Beach, Calif.

[21] Appl. No.: 316,287

[22] Filed: Sep. 30, 1994

[51] Int. Cl.[6] .................................................. H04B 1/10
[52] U.S. Cl. .......................... 455/296; 455/324; 455/326; 330/258
[58] Field of Search .............................. 455/295, 296, 455/317, 313, 306, 326, 310, 333, 341, 135, 234.1, 324, 232.1, 234.2; 330/9, 258, 259

[56] References Cited

U.S. PATENT DOCUMENTS

| 4,155,041 | 5/1979 | Burns et al. ............................ 455/135 |
| 4,476,585 | 10/1984 | Reed ....................................... 455/207 |
| 4,599,743 | 7/1986 | Reed ....................................... 455/207 |
| 4,653,117 | 3/1987 | Heck ....................................... 455/209 |
| 4,677,690 | 6/1987 | Reed ....................................... 455/207 |
| 4,701,719 | 10/1987 | Nagata .................................... 330/258 |
| 4,718,113 | 1/1988 | Rother et al. ........................... 455/209 |
| 4,944,025 | 7/1990 | Gehring et al. ......................... 455/207 |
| 5,003,621 | 3/1991 | Gailus ..................................... 455/209 |
| 5,052,050 | 9/1991 | Collier et al. .......................... 455/296 |
| 5,087,890 | 2/1992 | Ishiguro et al. ........................ 330/259 |
| 5,091,921 | 2/1992 | Minami . |
| 5,161,254 | 11/1992 | Braathen ................................ 455/306 |
| 5,254,956 | 10/1993 | Nishijima .............................. 330/258 |
| 5,392,003 | 2/1995 | Nag et al. ............................... 330/254 |

Primary Examiner—Andrew Faile
Assistant Examiner—Lee Nguyen
Attorney, Agent, or Firm—Kyle Eppele; M. Lee Murrah; G. A. Montanye

[57] ABSTRACT

An apparatus having a distortion cancelling feedback signal that suppresses undesired signal components. One embodiment of the present invention is comprised of a balanced mixer coupled to a common-mode detector, a filter and having a resulting feedback signal that suppresses the common-mode component of the mixer output signal while allowing the differential component of the mixer output signal to pass on to additional processing.

3 Claims, 6 Drawing Sheets

APPARATUS WITH DISTORTION CANCELLING FEEDBACK SIGNAL

BACKGROUND OF THE INVENTION

The present invention relates to electronic circuits and more particularly to electronic circuits using closed-loop control signals to minimize distortion.

Conventional mixers are widely used in a variety of electronic circuitry such as radios, cellular telephones or other devices, requiring the product of two waveform signals. Such mixers typically produce an output signal at a frequency that is the sum, or difference, of the two incoming signal frequencies. This output signal or "mixed" signal undergoes further processing to demodulate the desired data that is typically modulated on one of the signals. Prior art mixers can produce output signals having undesired components including direct current ("DC") caused by a nonlinear response of the mixer. An ideal mixer would form the product of two signals and not have these secondary non-linear responses. Some applications are less tolerant of accommodating such undesired signal components.

A direct conversion receiver ("DCR") is one such application where undesired signals from the mixer can render the receiver non-functioning. Typically, a DCR uses a balanced mixer that receives a radio frequency ("RF") signal and a local oscillator signal. The local oscillator and RF signal are at the same frequency and therefore the modulation on the RF signal is converted directly to baseband. In the presence of a strong applied RF signal which is off-channel or an undesired interfering signal, the second order distortion component in the nonlinear device which comprises the mixer causes a second harmonic and also creates a DC with an unmodulated RF signal, or a conversion of the modulated signal to baseband with a carrier signal that is amplitude modulated. Since the desired RF signal is also converted to zero IF and the modulation to baseband, this can interfere with the desired signal. This problem is often referred to as a spurious demodulation phenomena or direct detection. The undesired RF signal is directly detected or demodulated through second order distortion, not through mixing action, and thus is demodulated (if signal is strong) regardless of signal frequency.

SUMMARY OF THE INVENTION

The present invention comprises an active component that receives as one of its inputs a feedback signal. The active component is coupled to an extractor that identifies undesired signal components in the same frequency as desired components, filters the feedback signal and provides the same to the active component in order to reduce distortion. In one embodiment a balanced mixer in a DCR is the active component and is coupled to a common-mode detector and loop compensation filter. The desired signal exists in a differential-mode format and can accordingly be separated by fairly simple means.

In an alternate embodiment of the present invention an amplifier having a summer circuit to reject the differential signal and extract the common-mode signal. The amplifier would thus have balanced signal driven by an input signal with 180° phase difference.

It is an object of the present invention to provide common-mode signal extraction.

It is a feature of the present invention to utilize a feedback correction signal based upon a differential-mode extraction technique.

It is an advantage of the present invention that a desired component and an undesired component of an input signal and having the same frequency, can be effectively separated.

These and other objects and advantages are disclosed and claimed in the specification, figures and claims of the present invention.

DESCRIPTION OF THE PREFERRED EMBODIMENT

Figure 1:
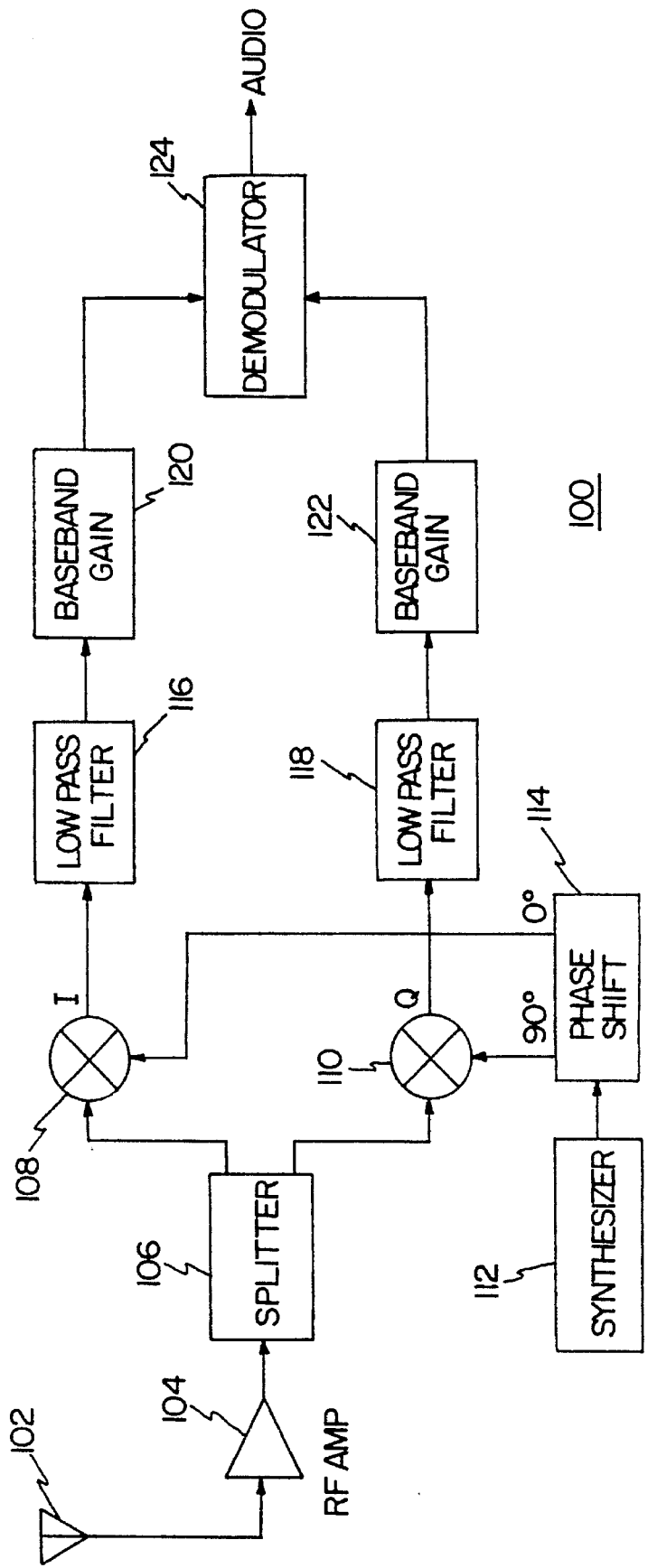
FIG. 1 is a block diagram of a direct conversion receiver, capable of incorporating the teachings of the present invention.

Referring now to the Figures, wherein like numbers are referenced as such throughout, FIG. 1 illustrates a direct conversion receiver 100 capable of benefiting from the teachings of the present invention. The receiver 100 would typically include an RF amplifier 104 and a splitter 106 for dividing an incoming RF communication signal into a pair of equal and inphase components. The RF components are combined at the mixers 108, 110 with separate injection signals on frequency with the communications signal but separated by a phase difference of 90° inphase. Inphase and quadrature baseband components are thereby formed which are independently filtered and amplified at audio frequencies on separate signal channels by separate filters 116, 118 and amplifiers 120, 122. The inphase and quadrature components formed as a result of the mixing process allow the signal to be conveniently and accurately demodulated upon being supplied to a suitable signal processing unit 124, such as a demodulator.

Figure 2:
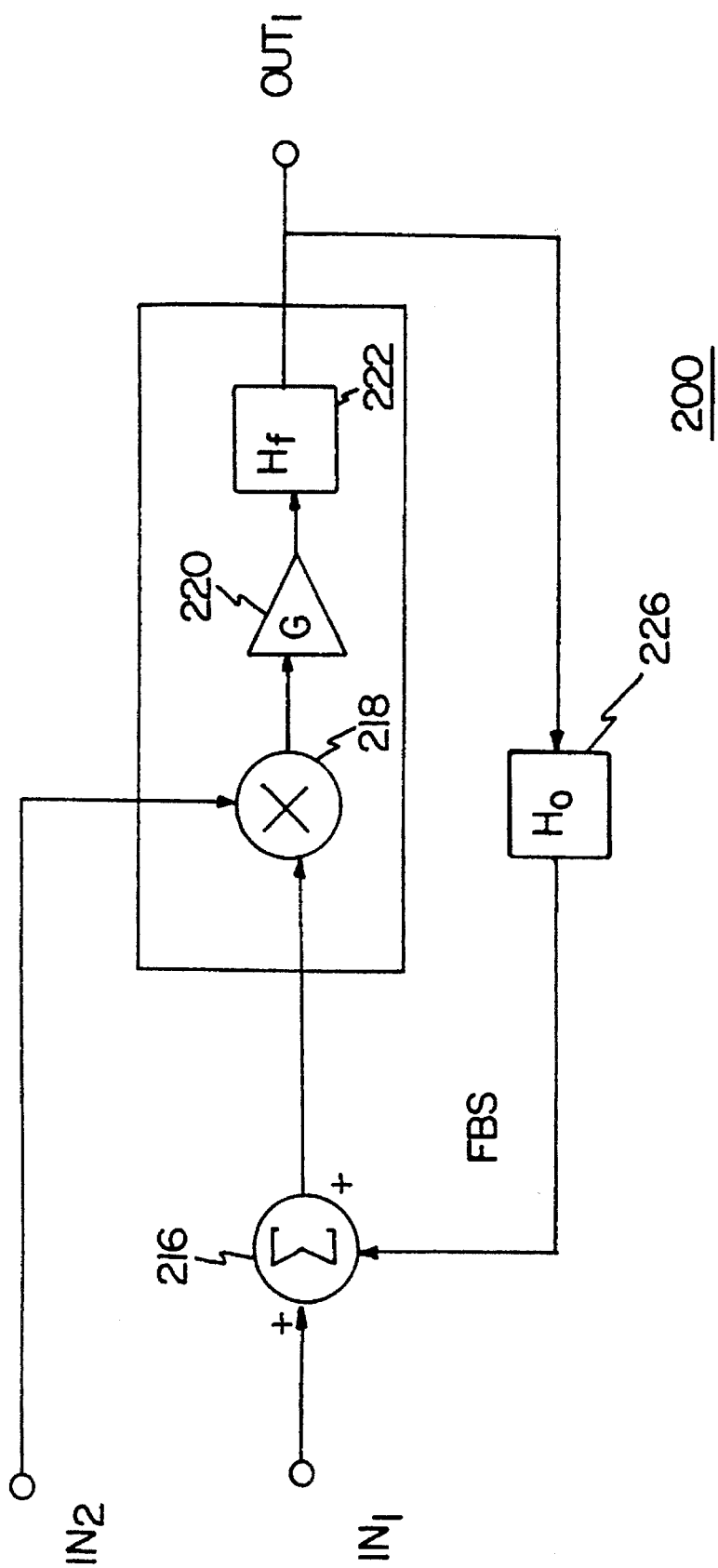
FIG. 2 is a block diagram of a prior-art feedback mixer.

FIG. 2 shows an active filtering mixer 200 as known in the prior art. A first input signal $IN_1$ is coupled to a summer 216, the output signal of the summer 216 is coupled to a multiplier 218, the multiplier 218 also receives a second input signal $IN_2$ thereby performing the mixing of the signals $IN_1$ and $IN_2$. The output signal of the multiplier 218 is coupled through an amplifier 220 whose output signal is in turn coupled through a high-pass filter 222 thereby yielding an output signal $OUT_1$. The output signal is also coupled in feedback fashion to the summer unit 216 via feedback selection means 226. The feedback selection means 226 filters or amplifies dependent upon the specified application to produce a feedback signal FBS which is coupled to summer 216.

The output of the multiplier 218 can be considered to have a desired component, and superimposed thereon an unwanted component. The feedback signal generated in feedback means 226 is a function of the signal components. Application of the feedback signal FBS to the multiplier 218 causes an unwanted component of its output to be largely suppressed. This result is obtained due to the multiplier 218 generating in its output a cancellation signal that suppresses the unwanted component.

Figure 3:
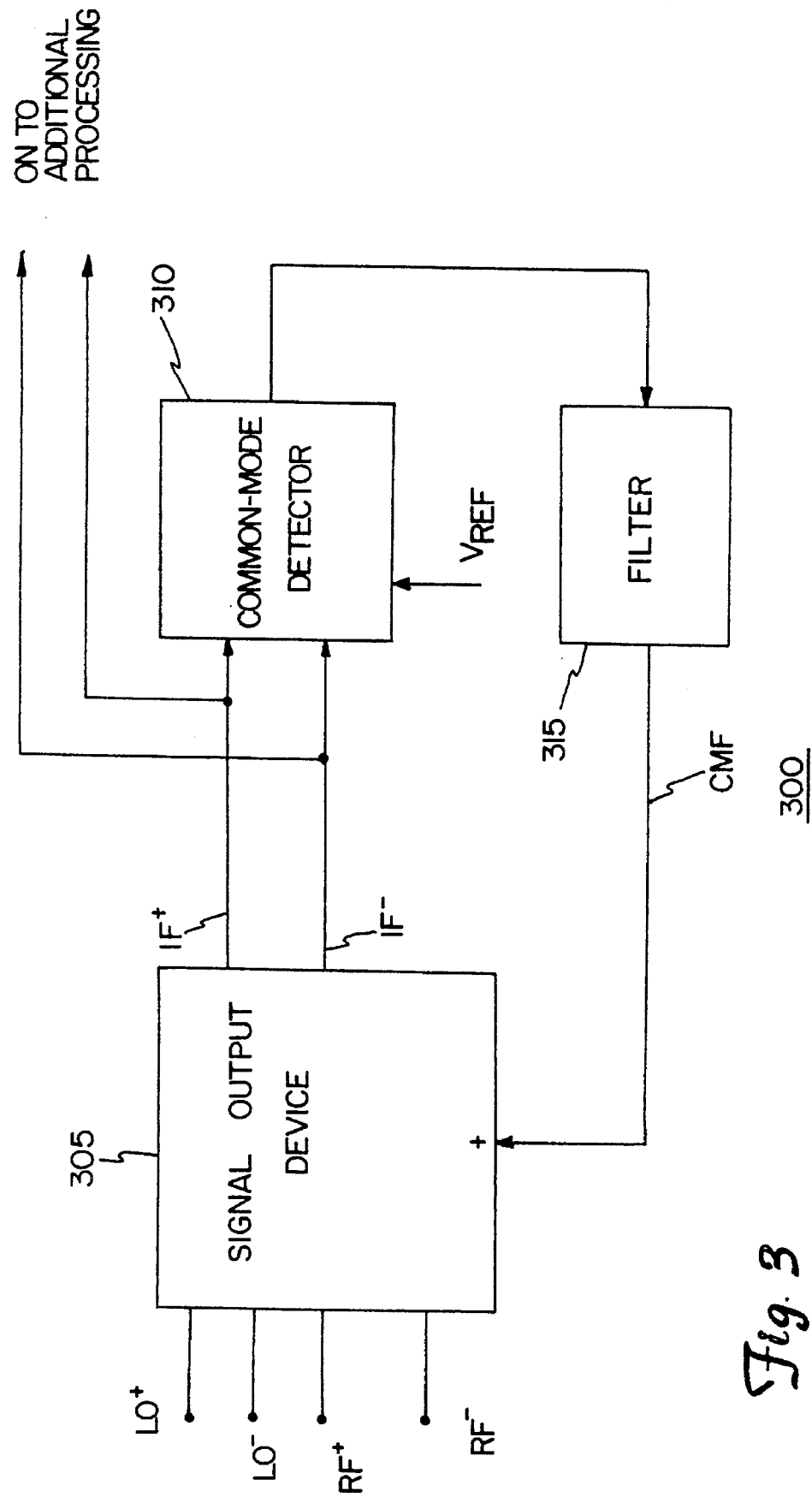
FIG. 3 is a block diagram of the teachings of the present invention.

FIG. 3 illustrates a high-level block diagram of one embodiment of the present invention. A signal output device 305 is coupled to a detector 310 which in turn is coupled to a filter 315 and provides a feedback signal to device 305. Device 305 may be either a mixer or an amplifier and is shown having two input signals each signal having an in phase (+) and out of phase (−) component. The input signals are representative of a local oscillator input signal ($LO^+$, $LO^-$) and a radio-frequency (RF) input signal ($RF^+$, $RF^-$). It is understood that the LO and RF input signals and intermediate frequency ($IF^+$, $IF^-$) are each characterized as differential signals.

As shown in FIG. 3, the IF signals are coupled to the detector 310. The detector 310 is a common-mode detector and ideally identifies any common-mode component in the IF signals and rejects any differential-mode signal component. Although the specific implementation of mixer or amplifier application would vary as subsequently described in detail, the operational concepts are similar and will now be discussed. Assuming a well balanced device 305, any second order (and any subsequent even order) distortion caused by device transistors will be a common-mode type signal distortion, the result of the squared term in the Taylor series that mathematically describes the nonlinearity of the device 305 transistors. The input signal to each transistor is 180° out of phase, but when squared becomes in-phase. Thus even order terms of the distortion components in collector currents of each device 305 transistor are in-phase.

The common-mode detector 310 receives the IF signals as its input removes the direct current (DC) component from each signal ($IF^+$, $IF^-$) and provides gain to establish closed-loop gain. The filter 315, then provides filtering to establish the closed-loop dynamics and may be described as a loop-compensation filter. The output signal CMF (common made feedback) of the filter 315 is then used to control a common current-source of balanced device 305. This scheme provides an effective way to alter the common-mode signal component in the IF signals and in conjunction with negative feedback signal CMF, suppress even order distortion.

As shown in FIG. 3, the detector 310 also has a reference input signal $V_{ref}$. The value of $V_{ref}$ is set to the desired collector voltage level in the device 305 which determines the DC level of the IF output. The feedback loop provides negative feedback to force the collector voltage to the level of $V_{ref}$. Fluctuations of the desired signal level are suppressed as long as the frequency of the fluctuations are within the closed-loop bandwidth. Since even order distortion causes fluctuations in each collector voltage in-phase, distortion is also suppressed.

The control loop of FIG. 3 therefore suppresses any common-mode signal variations utilizing negative feedback to the degree determined by the loop gain. Since the loop attempts to maintain the common-mode signal at the DC value of $V_{ref}$ and since fluctuations of $V_{ref}$ that are at a frequency inside the loop bandwidth are suppressed, the even mode distortion of the IF signals will also be suppressed.

Figure 4:
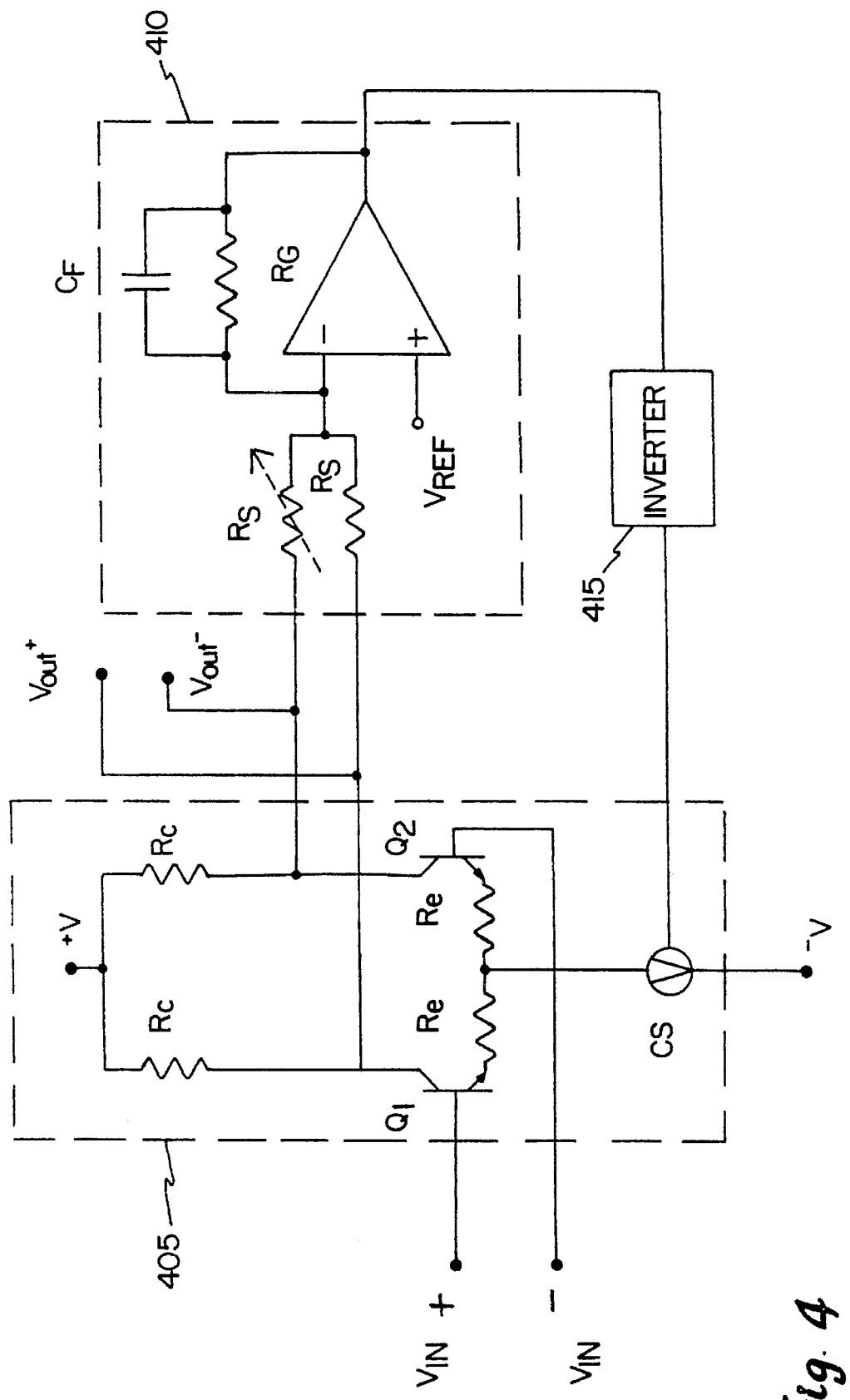
FIG. 4 is a schematic diagram of an amplifier utilizing the teachings of the present invention.

The scheme described in FIG. 3 may be used to suppress even order distortion in balanced amplifiers as previously mentioned. FIG. 4 illustrates a schematic diagram of a balanced amplifier 405 comprised of matched transistor $Q_1$, $Q_2$ and resistors $R_c$, $R_e$. The output signal $V_{out}^+$, $V_{out}^-$ will be balanced when driven by an input signal with a 180° phase difference. The second (and even) order distortion component of signal $V_{out}$ will be a common-mode type signal as explained above. To reject the differential component of signal $V_{out}$ and to extract the common-mode component of signal $V_{out}$, detector 410 comprises a summer, as shown. Ideally, device 410 cancels the differential component of the signal $V_{out}$ since it is exactly 180° split in-phase and doubles the common-mode component. The summation function can be readily accomplished utilizing the operational amplifier configuration depicted in FIG. 4. The DC reference signal is shown as $V_{ref}$ and is injected into the positive terminal of the operational amplifier. The gain of the loop can be established by the value of resistor $R_G$ coupled in a feedback manner as shown. Dominant pole compensation can be accomplished within device 410 by utilizing capacitor $C_F$ coupled in parallel with the resistor $R_G$. The output signal of the device 410 must be inverted by inverter 415 in order to provide a negative feedback signal to the current-source CS of the amplifier 405. The current-source controls the common-mode current of the amplifier and therefore also the DC output voltage. The negative feedback signal is fed to an auxiliary level control of the current-source and can therefore modify the common-mode operating point of the amplifier. This method of modification of the common-mode operating point assures that the differential signal will not be affected, which is what is desired.

Under ideal conditions, the DC level at each transistor $Q_1$, $Q_2$ collector terminal is forced by the loop to be equal in value to signal $V_{ref}$. Any common-mode fluctuations of the DC level, within the loop bandwidth are suppressed. If the collector resistors $R_C$ and the summation resistors $R_S$ are perfectly matched, the distortion will be suppressed to a degree that is determined by the closed-loop gain.

However, under conditions of matched resistors $R_C$ the common-mode distortion will not be manifested in the differential output signal, given that perfect differential to single ended conversion is accomplished. If the collector resistors are mismatched, a differential signal component will be created from a common-mode signal and distortion will also be found in the differential output signal.

It is also worth noting that when resistors $R_C$ are mismatched, a common-mode signal component can be created from the purely differential desired fundamental signal collector current. When this signal is detected by the common-mode detector and fed through the loop, output distortion can be created with a perfect input signal. If the mismatch of resistors $R_C$ is severe, the common-mode signal will be as large as the distortion common-mode signal, the total distortion could possibly increase.

The above described limitations may be overcome in either of two ways. First, one of the summation resistor $R_S$ may be made variable (indicated in Figure by dashed arrow). The variable summation resistor $R_S$ could then be trimmed to compensate for the mismatch in the collector resistors $R_C$ and the resultant suppression of the loop would then approach the ideal situation. Alternatively, the output signal may be handled in a single-ended manner. The distortion in a single output would be suppressed even with mismatched collector resistors $R_C$.

Figure 5:
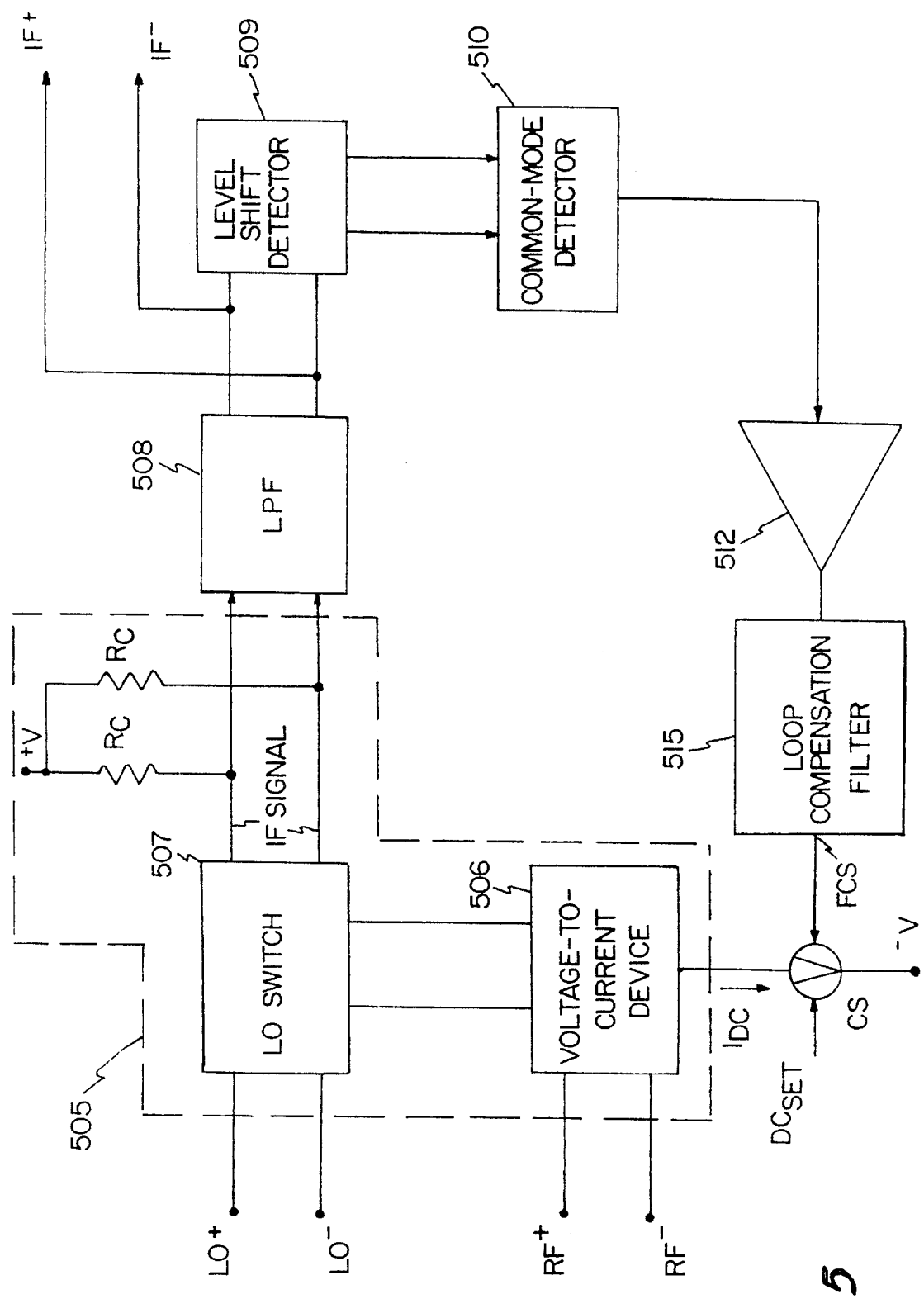
FIG. 5 is a block diagram of a mixer incorporating the teachings of the present invention.
Figure 6:
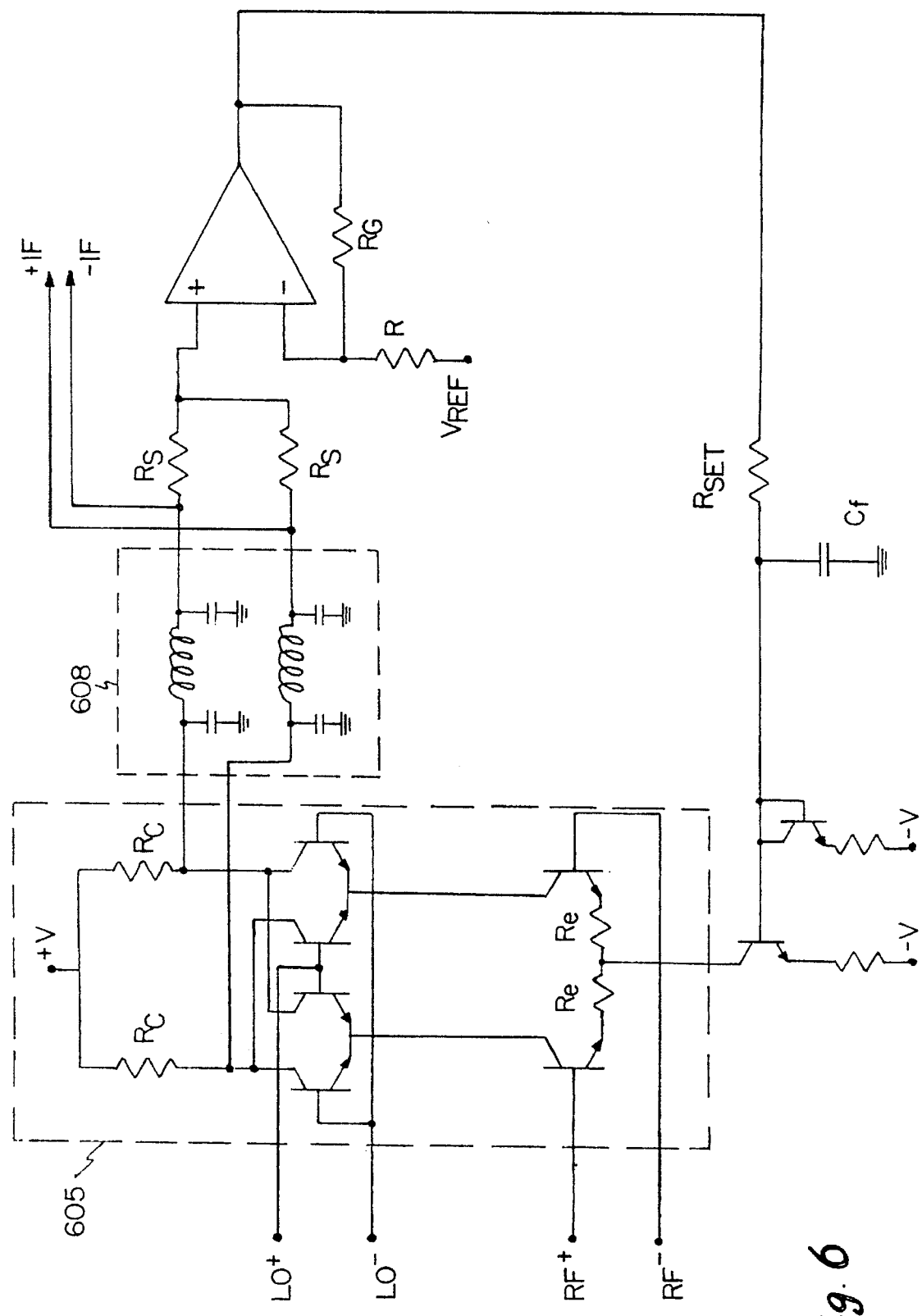
FIG. 6 is a schematic diagram of the mixer of FIG. 5.

FIG. 5 depicts a block diagram of a mixer utilizing the concepts discussed above in conjunction with FIG. 3. A balanced active mixer 505 is comprised of a voltage-to-current device 506 and an LO switch 507, and may be implemented as parts of a Gilbert cell active mixer, as schematically depicted in FIG. 6. The output signal of the mixer 505 $IF^+$, $IF\_$is coupled to a low-pass filter, which passes baseband frequencies and rejects the LO and RF frequencies. A representative passband selected was 750 kHz, although other cutoff frequencies could also be used. A level shift detector 509 is coupled to the output signals of filter 508. Level shift detector 509 performs extraction of the filter 508 and couples its output to detector 510. The detector 510 is a common-mode detector whose operation has already been described above (see FIG. 4). Loop gain and filtering is subsequently accomplished. Devices 512, 515 and the output signal FCS is coupled to the mixer 505 via current-source CS, in order to provide the desired common-mode suppression. The current-source is voltage controlled and provides for alteration of the common-mode operating point, while having no effect on the desired differential signals.

At first glance the above scheme might appear inappropriate for a mixer application, since the IF frequency is different from the RF frequency and a feedback loop could not provide suppression at the appropriate frequency. However, with the spurious demodulation problem, the distortion frequency is at baseband and the loop will suppress the baseband distortion since the LPF 508 will ideally only pass that component. In a DCR, the desired signal is mixed to baseband also, but is in a differential format. The inclusion of the LPF 508 is made necessary to suppress RF interferers, LO leakage and the like, since any such components in the signal coupled to the detector 510 would disrupt distortion cancellation. Although any such filtered components would be in differential-mode, mismatch in the mixer 505 collector resistors RC would create a low-level common-mode component which would require filtering.

FIG. 6 illustrates a schematic diagram of one implementation of a mixer and feedback loop set forth in FIG. 5. The LPF 608 is a three-pole device with separate paths for each balanced output signal. As depicted, the LPF 608 provides rejection to both differential and common-mode signal components. Common-mode detection is implemented as previously described in FIG. 4. Loop gain is set by the operational amplifier circuit gain. Reference signal $V_{ref}$ is provided to the operational amplifier to provide a reference for the collector voltage of the mixer 605. The detector 510 output signal is filtered and applied to the mixer current-source CS (See FIG. 5). The current-source level is altered by this input voltage, which in turn modifies the output voltage (common-mode only) of the mixer 605. Dominant pole compensation, provided by resistor $R_{SET}$ and capacitor $C_p$, is utilized in light of the poles of the LPF 608. It is understood that a design tradeoff exists between the desire to have a low cutoff frequency for the LPF 608 and the necessity to minimize the phase shift within the loop bandwidth to make the loop stable.

A key to making the above described approach operable is the separation of the desired demodulated signal from the undesired demodulated signal and also keeping any RF signals out of the feedback loop. The separation of the demodulated signals occurs because the desired signal is in differential format, while the undesired signal component is in common-mode form. A mismatch in collector resistors or summation resistors will cause deviation from the ideal situation. However, even for a one percent mismatch between the collector or summation resistors, the separation will still be approximately forty decibels.

Interfering signals in the RF frequency range can be at high levels, while the desired signal is at a low level. All RF signals need to be kept out of the feedback loop since the RF signals would not be at the same frequency after mixing as the desired RF signal and would cause the loop to respond incorrectly. Interfering signals will be differential in the mixer but will have a common-mode component created by collector or summation resistor mismatch. The anticipated degree of mismatch of such resistors will create a common-mode level that is too high with a strong RF signal at the input port and therefore more help is provided by low-pass filtering. In the case of a DCR, all undesired signals are at RF, while the desired signal and the distortion needed in the feedback signal to cancel mixer distortion is at baseband.

The above described technique and apparatus will not cancel distortion in a mixer caused by odd-order non-linearities. For this reason the teachings of this application are deemed to be application specific to DCRs where even order distortions (second order being more dominant) present a major problem.

Those skilled in the art will readily recognize that various modifications and changes may be made to the present invention without departing from the true spirit and scope thereof, which is set forth in the following claims.

I claim:

1. An apparatus having a closed-loop control signal for suppressing common-mode signal distortion comprising:
    a balanced mixer having an output signal with a differential and a common-mode component;
    a low-pass filter coupled to the output signal of the balanced mixer having characteristics that pass baseband frequency signals of the balanced mixer output signal;
    a level shift detector coupled to the passed signals of the low-pass filter, thereby yielding an extracted signal;
    a common-mode detector coupled to the level shift detector extracted signal that suppresses the common-mode component of the extracted signal;
    a voltage controlled current source having an input signal from the common-mode detector and having its output signal coupled to the balanced mixer; and
    an amplifier disposed between and coupled to the common-mode detector and the current source.

2. The apparatus of claim 1, further comprising a loop compensation filter coupled to the amplifier and the current source.

3. A method for suppressing distortion in a RF receiver comprising the following steps:
    mixing a received RF signal with an output signal of a local oscillator thereby creating an intermediate signal;
    filtering the local oscillator and RF frequencies from the intermediate signal;
    extracting the resultant signal of the filtering step;
    suppressing common-mode component of the RF signal at the resultant extracted signal;
    amplifying the resultant signal of the suppressing step; and
    electrically coupling the resultant signal of the suppressed extracted signal to a current source that provides a current signal to the mixing step.

* * * * *